(12) United States Patent
Lee

(10) Patent No.: US 10,147,491 B2
(45) Date of Patent: Dec. 4, 2018

(54) SEMICONDUCTOR MEMORY DEVICE AND PROGRAMMING METHOD THEREOF

(71) Applicant: SK hynix Inc., Gyeonggi-do (KR)

(72) Inventor: Un Sang Lee, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/630,631

(22) Filed: Jun. 22, 2017

(65) Prior Publication Data
US 2018/0068733 A1 Mar. 8, 2018

(30) Foreign Application Priority Data
Sep. 8, 2016 (KR) .................... 10-2016-0115844

(51) Int. Cl.
*G11C 16/10* (2006.01)
*G11C 16/20* (2006.01)
*G11C 16/14* (2006.01)
*G11C 16/34* (2006.01)
*G11C 11/56* (2006.01)

(52) U.S. Cl.
CPC .......... *G11C 16/20* (2013.01); *G11C 11/5628* (2013.01); *G11C 16/102* (2013.01); *G11C 16/14* (2013.01); *G11C 16/3418* (2013.01); *G11C 16/3459* (2013.01); *G11C 2211/5648* (2013.01)

(58) Field of Classification Search
CPC . G11C 16/10; G11C 16/3459; G11C 11/5628; G11C 16/26; G11C 16/0483; G11C 11/5642; G11C 16/04; G11C 16/3431
See application file for complete search history.

(56) References Cited

U.S. PATENT DOCUMENTS

| 9,916,900 | B2* | 3/2018 | Kim ................. G11C 16/14 |
| 2012/0120740 | A1* | 5/2012 | Shim ................ G11C 16/14 365/189.14 |
| 2012/0314506 | A1* | 12/2012 | Baek ................ G11C 7/12 365/185.25 |
| 2013/0163324 | A1* | 6/2013 | Noh .................. G11C 11/5628 365/185.02 |
| 2014/0211565 | A1* | 7/2014 | Song ................. G11C 11/5628 365/185.03 |

FOREIGN PATENT DOCUMENTS

| KR | 100801035 | 2/2008 |
| KR | 100818717 | 4/2008 |
| KR | 1020120076787 | 7/2012 |

* cited by examiner

*Primary Examiner* — Hien Nguyen
(74) *Attorney, Agent, or Firm* — IP & T Group LLP

(57) ABSTRACT

A semiconductor memory device includes a memory cell array, a peripheral circuit and a control logic. The memory cell array includes a plurality of memory cells each of which stores 2 or more bits of data. The peripheral circuit is configured to perform a program operation for the memory cells in the memory cell array. The control logic is configured to control the peripheral circuit and the memory cell array such that, during a program operation for target memory cells to be programmed among the memory cells, a preprogram for memory cells to be programmed to the highest program state is performed based on a predetermined value, and after the preprogram has been performed, a main program for the target memory cells to be programmed is performed.

20 Claims, 15 Drawing Sheets

SEMICONDUCTOR MEMORY DEVICE AND PROGRAMMING METHOD THEREOF

CROSS-REFERENCE TO RELATED APPLICATION

The present application claims priority under 35 U.S.C. § 119(a) to Korean patent application number 10-2016-0115844, filed on Sep. 8, 2016, the entire disclosure of which is incorporated herein by reference in its entirety.

BACKGROUND

Field of Invention

Various embodiments of the present disclosure relate to an electronic device and, more particularly, to a semiconductor memory device and a programming method thereof.

Description of Related Art

Semiconductor devices, in particular, semiconductor memory devices are classified into volatile memory devices and nonvolatile memory devices.

The nonvolatile memory devices maintain data stored therein even when supply of power is interrupted, although read and write speeds are comparatively low. Therefore, nonvolatile memory devices are used when there is a need for storing data which must be maintained regardless of the status of the power supply. Representative examples of the nonvolatile memory devices include a ROM (Read Only Memory), an MROM (Mask ROM), a PROM (Programmable ROM), an EPROM (Erasable Programmable ROM), an EEPROM (Electrically Erasable Programmable ROM), a flash memory, a PRAM (Phase change Random Access Memory), an MRAM (Magnetic RAM), an RRAM (Resistive RAM), and an FRAM (Ferroelectric RAM). The flash memory is classified into a NOR type memory and a NAND type memory.

Flash memory devices may be a two-dimensional semiconductor device in which cell strings are horizontally formed on a semiconductor substrate, or a three-dimensional semiconductor device in which cell strings are vertically formed on a semiconductor substrate. Three-dimensional semiconductor memory devices were devised to overcome the limitations in the degree of integration of two-dimensional semiconductor memory devices and include a plurality of cell strings which are vertically formed on a semiconductor substrate. Each string includes a drain select transistor, a plurality of memory cells and a source select transistor which are coupled in series between a bit line and a common source line (SL). However, due to their increased degree of integration memory devices are subject to interference between neighboring memory cells.

SUMMARY

Various embodiments of the present disclosure are directed to a semiconductor memory device capable of reducing effects of interference and disturbance from adjacent memory cells during a program operation.

Furthermore, various embodiments of the present disclosure are directed to a method of reducing effects of interference and disturbance from adjacent memory cells during a program operation of a semiconductor memory device.

In one aspect of the present disclosure, there is provided a semiconductor memory device including: a memory cell array including a plurality of memory cells each of which stores N-bit data (N is an integer greater than 1); a peripheral circuit configured to perform a program operation to the memory cells in the memory cell array; and a control logic configured to control the peripheral circuit and the memory cell array such that, during a program operation to target memory cells to be programmed among the memory cells, a preprogram is performed to memory cells to be programmed to a highest program state among the target memory cells based on a preprogram reference voltage, then a main program is performed to the target memory cells.

In an embodiment, each of the target memory cells may store 2-bit data and is initially in an erase state. The control logic may control the peripheral circuit and the memory cell array such that a preprogram is performed to memory cells to be programmed to the highest program state among the target memory cells based on a first reference voltage corresponding to the highest program state.

In an embodiment, each of the target memory cells may store 2-bit data and is initially in an erase state. The control logic may control the peripheral circuit and the memory cell array such that a preprogram is performed to memory cells to be programmed to the highest program state among the target memory cells based on a first reference voltage corresponding to the highest program state, and a preprogram is performed for memory cells to be programmed to a second highest program state among the target memory cell based on a second reference voltage corresponding to the second highest program state and lower than the first reference voltage.

In an embodiment, each of the target memory cells stores 2-bit data and is initially in an erase state. The control logic may control the peripheral circuit and the memory cell array such that a preprogram is to performed to memory cells to be programmed to the highest program state among the target memory cells based on a first reference voltage corresponding to the highest program state, a preprogram is performed to memory cells to be programmed to a second highest program state based on a second reference voltage corresponding to the second highest program state and lower than the first reference voltage, and a preprogram is performed to memory cells to be programmed to a third highest program state among the target memory cells based on a third reference voltage corresponding to the third highest program state and lower than the second reference voltage.

In an embodiment, the first reference voltage may be lower than a highest verify voltage used for verifying the main program to the highest program state.

In an embodiment, the first and the second reference voltages may be lower than highest and second highest verify voltages used for verifying the main program to the highest and second highest program states, respectively.

In an embodiment, the first to third reference voltages may be lower than highest, second highest and third highest verify voltages used for verifying the main program to the highest, second highest and third highest program states, respectively.

In an embodiment, each of the target memory cells may store 3-bit data and be initially in an erase state. The control logic may control the peripheral circuit and the memory cell array such that a preprogram is performed to memory cells to be programmed to the highest program state among the target memory cells based on a first reference voltage corresponding to the highest program state.

In an embodiment, each of the target memory cells may store N-bit data and be initially in an erase state. The control logic may control the peripheral circuit and the memory cell array such that a preprogram is performed to memory cells to be programmed to the highest program state among the target memory cells based on a first reference voltage corresponding to the highest program state.

In another aspect of the present disclosure, there is provided a method of programming a semiconductor memory device comprising a memory cell array including a plurality of memory cells each of which stores N-bit data (N is an integer greater than 1), the method including: determining at least one program target state including a highest program state and at least one preprogram reference voltage corresponding to the preprogram target state; preprogramming one or more among target memory cells, based on the preprogram target state and the preprogram reference voltage; and main-programming the target memory cells.

In an embodiment, each of the target memory cells may store 2-bit data and is initially in an erase state, and the determining of the preprogram target state and the preprogram reference voltage may include determining the highest program state as the preprogram target state, and determining a first reference voltage corresponding to the highest program state.

In an embodiment, the preprogramming of one or more among the target memory cells may include preprogramming memory cells to be programmed to the highest program state among the target memory cells based on the first reference voltage. The first reference voltage may be lower than a highest verify voltage used for verifying main program to the highest program state in the main-programming of the target memory cells.

In an embodiment, each of the target memory cells may store 2-bit data and be initially in an erase state. The determining of the preprogram target state and the preprogram reference voltage may include determining the highest program state and a second highest program state as the preprogram target state, and determining a first reference voltage corresponding to the highest program state and a second reference voltage corresponding to the second highest program state and lower than the first reference voltage.

In an embodiment, the preprogramming of one or more among the target memory cells may include: preprogramming memory cells to be programmed to the highest program state among the target memory cells based on the first reference voltage; and preprogramming memory cells to be programmed to the second highest program state among the target memory cells based on the second reference voltage. The first and second reference voltages may be lower than highest and second highest verify voltages used for verifying main program to the highest and second highest program states, respectively, in the main-programming of the target memory cells.

In an embodiment, the preprogramming of one or more among the target memory cells may include: preprogramming memory cells to be programmed to the highest program state among the target memory cells based on the first reference voltage; and preprogramming memory cells to be programmed to the highest and the second highest program state among the target memory cells based on the second reference voltage. The first and second reference voltages may be lower than highest and second highest verify voltages used for verifying main program to the highest and second highest program states, respectively, in the main-programming of the target memory cells.

In an embodiment, each of the target memory cells may store 2-bit data and be initially in an erase state. The determining of the preprogram target state and the preprogram reference voltage may include determining the highest program state and second and third highest program states as the preprogram target state, and determining a first reference voltage corresponding to the highest program state, a second reference voltage corresponding to the second highest program state and lower than the first reference voltage, and a third reference voltage corresponding to the third highest program state and lower than the second reference voltage.

In an embodiment, the preprogramming of one or more among the target memory cells may include: preprogramming memory cells to be programmed to the highest program state among the target memory cells based on the first reference voltage; preprogramming memory cells to be programmed to the second highest program state among the target memory cells based on the second reference voltage; and preprogramming memory cells to be programmed to the third highest program state among the target memory cells based on the third reference voltage. The first to third reference voltages may be lower than highest and second and third highest verify voltages used for verifying main program to the highest and second and third highest program states, respectively, in the main-programming of the target memory cells.

In an embodiment, the preprogramming of one or more among the target memory cells may include: preprogramming memory cells to be programmed to the highest program state among the target memory cells based on the first reference voltage; preprogramming memory cells to be programmed to the highest and the second highest program states among the target memory cells based on the second reference voltage; and preprogramming memory cells to be programmed to the highest and the second and third highest program states among the target memory cells based on the third reference voltage. The first to third reference voltages may be lower than highest and second and third highest verify voltages used for verifying main program to the highest and second and third highest program states, respectively, in the main-programming of the target memory cells.

In an embodiment, each of the target memory cells may store 3-bit data and be initially in an erase state. The determining of the preprogram target state and the preprogram reference voltage may include determining the highest program state as the preprogram target state, and determining a first reference voltage corresponding to the highest program state.

In an embodiment, each of the target memory cells may store N-bit data and be initially in an erase state. The determining of the preprogram target state and the preprogram reference voltage may include determining the highest program state as the preprogram target state, and determining a first reference voltage corresponding to the highest program state.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
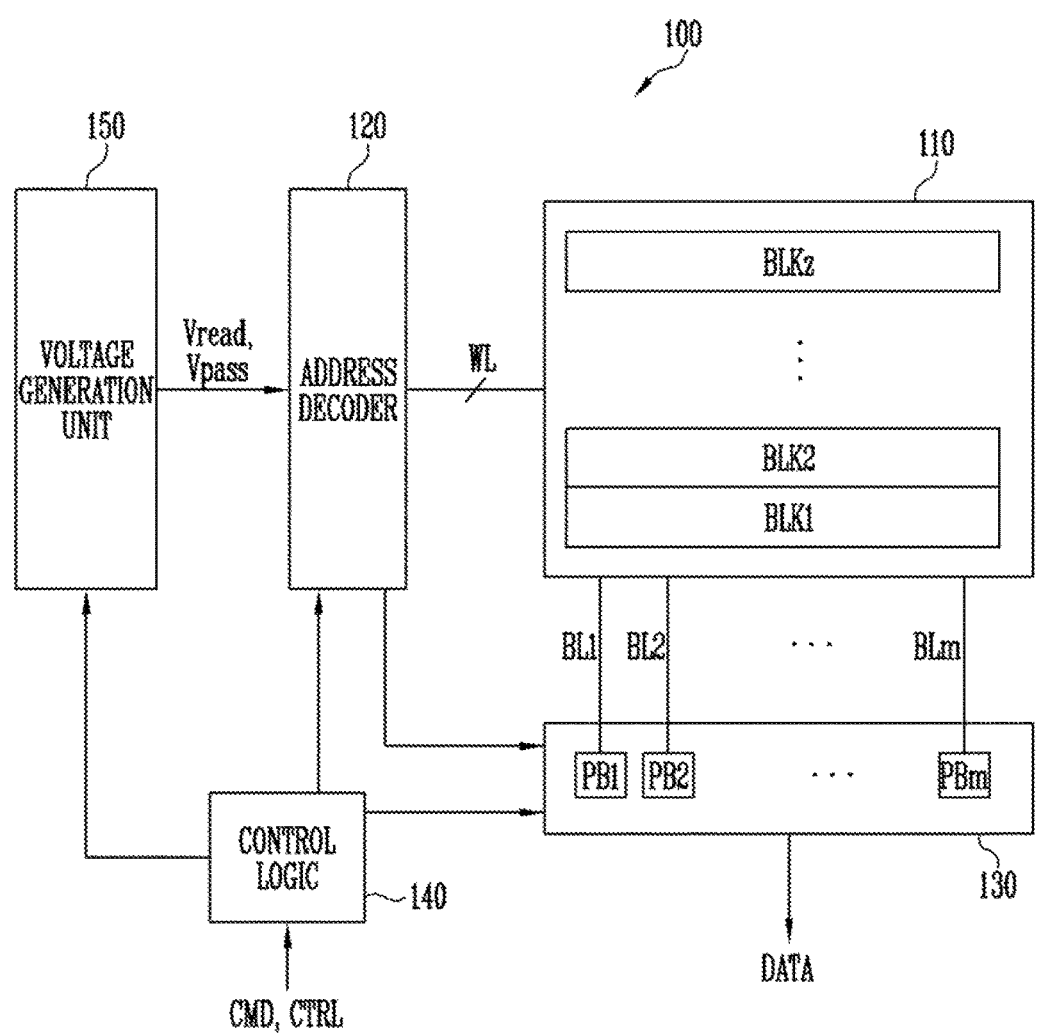
FIG. 1 is a block diagram illustrating a semiconductor memory device, in accordance with an embodiment of the present disclosure.

Hereinafter, embodiments will be described in greater detail with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned otherwise in the specification. It will be further understood that the terms "comprises," "comprising," "includes," and "including" when used in this specification, specify the presence of the stated elements and do not preclude the presence or addition of one or more other elements.

Furthermore, unless defined otherwise, all the terms used in this specification including technical and scientific terms have the same meanings as would be generally understood by those skilled in the related art in view of the present disclosure. The terms defined in generally used dictionaries should be construed as having the same meanings as would be construed in the context of the present disclosure and the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 is a block diagram illustrating a semiconductor memory device, in accordance with an embodiment of the present disclosure.

Referring to FIG. 1, a semiconductor memory device 100 includes a memory cell array 110, an address decoder 120, a read/write circuit 130, a control logic 140, and a voltage generation unit 150.

The memory cell array 110 includes a plurality of memory blocks BLK1 to BLKz. The memory blocks BLK1 to BLKz are coupled to the address decoder 120 through a plurality of word lines WL. The memory blocks BLK1 to BLKz are coupled to the read/write circuit 130 through a plurality of bit lines BL1 to BLm. Each of the memory blocks BLK1 to BLKz includes a plurality of memory cells. In an embodiment, the plurality of memory cells may be nonvolatile memory cells and be configured with nonvolatile memory cells having a vertical channel structure. In an embodiment, the memory cell array 110 may be formed of a memory cell array having a two-dimensional structure. In an embodiment, the memory cell array 110 may be formed of a memory cell array having a three-dimensional structure. Each of the memory cells included in the memory cell array may store at least two bits of data. In an embodiment, each of the memory cells included in the memory cell array 110 may be a multi-level cell (MLC), which stores 2-bit data. In another embodiment, each of the memory cells included in the memory cell array 110 may be a triple-level cell, which stores 3-bit data. In still another embodiment, each of the memory cells included in the memory cell array 110 may be a quad-level cell, which stores 4-bit data. In various embodiments, the memory cell array 110 may include a plurality of memory cells each of which stores five or more bits of data.

The address decoder 120, the read/write circuit 130, and the control logic 140 function as a peripheral circuit for driving the memory cell array 110. The address decoder 120 is coupled to the memory cell array 110 through the word lines WL. The address decoder 120 is configured to operate in response to control of the control logic 140. The address decoder 120 receives addresses through an input/output buffer (not shown) provided in the semiconductor memory device 100.

The address decoder 120 is configured to decode a block address among the received addresses. The address decoder 120 selects at least one memory block in response to the decoded block address. When a read voltage application operation is performed during a read operation, the address decoder 120 may apply a read voltage Vread generated from the voltage generation unit 150, to a selected word line of a selected memory block and apply a pass voltage Vpass to the other unselected word lines. During a program verify operation, the address decoder 120 may apply a verify voltage generated from the voltage generation unit 150, to a selected word line of a selected memory block, and apply a pass voltage Vpass to the other unselected word lines.

The address decoder 120 is configured to decode a column address among the received addresses. The address decoder 120 may transmit the decoded column address to the read/write circuit 130.

The read or program operation of the semiconductor memory device 100 is performed on a page basis. Addresses received in a request for a read or program operation may include a block address, a row address and a column address. The address decoder 120 selects one memory block and one word line in accordance with a block address and a row address. The column address is decoded by the address decoder 120 and provided to the read/write circuit 130.

The address decoder 120 may include a block decoder, a row decoder, a column decoder, an address buffer, etc.

The read/write circuit 130 includes a plurality of page buffers PB1 to PBm. The read/write circuit 130 may be operated as a read circuit during a read operation of the memory cell array 110 and as a write circuit during a write operation. The plurality of page buffers PB1 to PBm are coupled to the memory cell array 110 through the bit lines BL1 to BLm. During a read or program operation, to sense threshold voltages of the memory cells, the page buffers PB1 to PBm may continuously supply sensing current to the bit lines coupled to the memory cells, and each page buffer may sense, through a sensing node, a change in the amount of flowing current depending on a program state of a corresponding memory cell and latch it as sensing data. The read/write circuit 130 is operated in response to page buffer control signals outputted from the control logic 140.

During a read operation, the read/write circuit 130 may sense data of the memory cells and temporarily store read-out data, and then output data DATA to the input/output buffer (not shown) of the semiconductor memory device 100. In an embodiment, the read/write circuit 130 may include a column select circuit or the like as well as the page buffers (or page resistors).

The control logic 140 is coupled to the address decoder 120, the read/write circuit 130, and the voltage generation unit 150. The control logic 140 may receive a command CMD and a control signal CTRL through the input/output buffer (not shown) of the semiconductor memory device 100. The control logic 140 is configured to control the overall operation of the semiconductor memory device 100 in response to the control signal CTRL. The control logic 140 may output a control signal for controlling the sensing node precharge potential levels of the plurality of page buffers PB1 to PBm. The control logic 140 may control the read/write circuit 130 to perform a write operation of the memory cell array 110.

The voltage generator 150 generates a read voltage Vread and a pass voltage Vpass during a read operation in response to a voltage generation unit control signal outputted from the control logic 140.

In accordance with an embodiment of the present disclosure, the control logic 140 of the semiconductor memory device 100 may control the peripheral circuit and the memory cell array such that, during a program operation to target memory cells among the memory cells in the memory cell array 110, a preprogram to one or more memory cells to be programmed to the highest program state among the target memory cells is performed based on a preprogram reference voltage. After the preprogram is performed, the control logic 140 may control the peripheral circuit and the memory cell array such that a main program is performed to the target memory cells.

Particularly, in accordance with an embodiment of the present disclosure, the control logic 140 of the semiconductor memory device 100 may control the peripheral circuit and the memory cell array such that during a program operation to memory cells storing two or more bits of data, a preprogram is performed on the basis of the preprogram reference voltage to memory cells to be programmed to the highest program state among the target memory cells. Through the preprogram, based on the preprogram reference voltage, to one or more memory cells to be programmed to the highest program state among the target memory cells, effects of interference and disturbance may be reduced during the main program to the target memory cells originally in an erased state.

Figure 2:
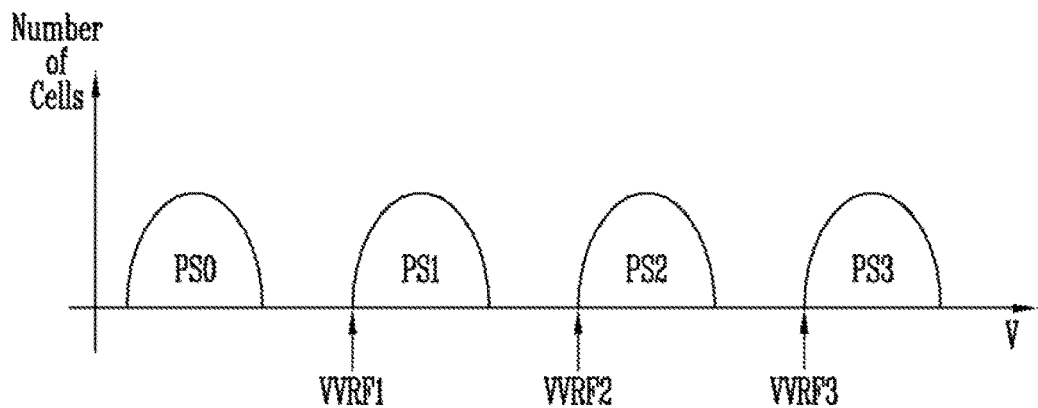
FIG. 2 is a diagram illustrating a program state of a memory cell which stores 2-bit data.

FIG. 2 is a diagram illustrating a program state of a memory cell which stores 2-bit data.

Referring to FIG. 2, there are illustrated four kinds of program states of memory cells storing 2-bit data. For example, memory cells storing 2-bit data may have, by a program operation, any one program state among an erase state PS0, a first program state PS1, a second program state PS2 and a third program state PS3. The first to third program states PS1, PS2 and PS3 may be respectively programmed based on corresponding first to third verify voltages VVRF1, VVRF2 and VVRF3. In accordance with the present disclosure, the preprogram is performed on the basis of the preprogram reference voltage to one or more memory cells to be programmed to the third program state PS3, among the target memory cells in advance so as to move threshold voltages of the one or more memory cells to an intermediate program state. The third program state is the highest program state and thus it is determined to be the preprogram target state. This way, effects of interference and disturbance may be reduced significantly during the main program to the target memory cells based on the first to third verify voltages VVRF1, VVRF2 and VVRF3 after the preprogram.

Figure 3:
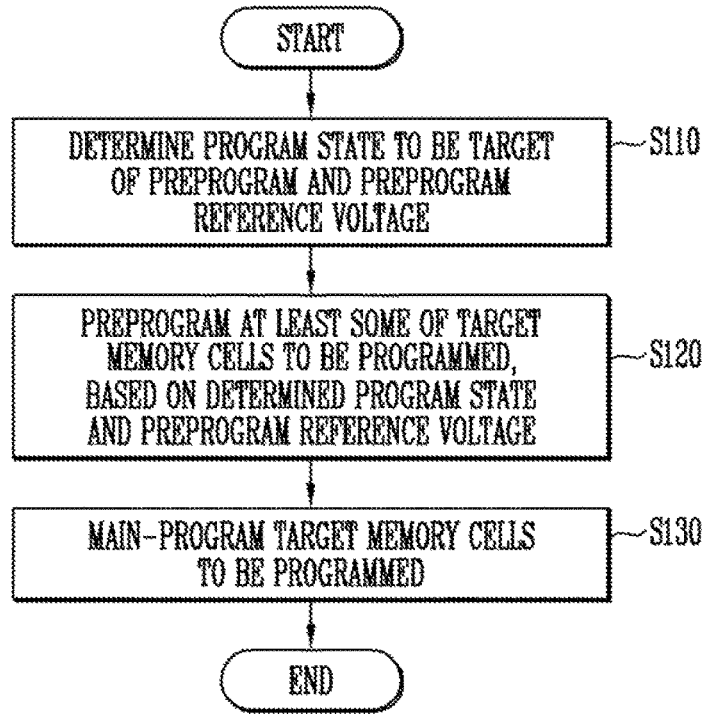
FIG. 3 is a flowchart showing a method of programming a semiconductor memory device, in accordance with an embodiment of the present disclosure.

FIG. 3 is a flowchart showing a method of programming a semiconductor memory device, in accordance with an embodiment of the present disclosure.

Referring to FIG. 3, the method of programming the semiconductor memory device, in accordance with the embodiment of the present disclosure, includes: step S110 of determining at least one preprogram target state and at least one preprogram reference voltage for the preprogram target state; step S120 of preprogramming at least some of the target memory cells which are based on the preprogram target state and the preprogram reference voltage; and step S130 of main-programming the target memory cells.

In an embodiment, at step S110, the third program state PS3, which is the highest program state among the program states shown in FIG. 2, may be determined as the preprogram target state. That is, it may be determined to perform a preprogram on the basis of the preprogram reference voltage to one or more memory cells to be programmed to the third program state PS3 among the target memory cells.

In another embodiment, at step S110, it may be determined to successively perform preprograms on the basis of the preprogram reference voltages to one or more memory cells to be programmed to the third program state PS3 and the second program state PS2 as the preprogram target states among the target memory cells. In still another embodiment, at step S110, it may be determined to successively perform preprograms on the basis of the preprogram reference voltages to one or more memory cells to be programmed to the third program state PS3, the second program state PS2 and the first program state PS1 as the preprogram target state among the target memory cells.

Furthermore, at step S110, the preprogram reference voltage to be used for each preprogram for each preprogram target state may also be determined.

At step S120, among the target memory cells, one or more memory cells to be programmed to the preprogram target state may be preprogrammed based on the corresponding preprogram reference voltage. In an embodiment, in the case of memory cells storing 2-bit data, at step S120, the preprogram may be performed on the basis of the preprogram reference voltage to one or more memory cells to be programmed to the third program state PS3 as the preprogram target state among the target memory cells. In another embodiment, at step S120, preprograms may be successively performed on the basis of the preprogram reference voltages to one or more memory cells to be programmed to the third program state PS3 and the second program state PS2 as the preprogram target states among the target memory cells. In still another embodiment, at step S120, preprograms may be successively performed on the basis of the preprogram reference voltages to one or more memory cells to be programmed to the third program state PS3, the second program state PS2 and the first program state PS1 as the preprogram target states among the target memory cells.

At step S130 after the preprogram of step S120, the target memory cells may be programmed to the first to third program states PS1 to PS3 through the main program. In an embodiment, the main program may be performed by the incremental step pulse program (ISPP) method. For example, during the main program, an incremental step pulse, which increases by a predetermined voltage level for each program loop, may be applied to the target memory cells, and verify voltages VVRF1, VVRF2 and VVRF3 respectively corresponding to the program states PS1, PS2 and PS3 may be applied to the target memory cells so as to verify whether the target memory cells have been programmed to the program states PS1 to PS3.

The method of programming the semiconductor memory device including memory cells each storing 2-bit data has been mainly described above, and the method of programming a semiconductor memory device including memory cells each storing 3-bit data will be described later herein with reference to FIGS. 14 and 15.

Figure 4:
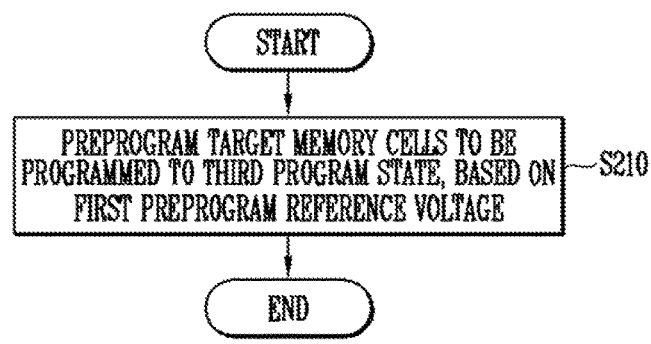
FIG. 4 is a flowchart illustrating an example of a preprogram step shown in FIG. 3.

FIG. 4 is a flowchart illustrating an example of the preprogram step of S120 shown in FIG. 3.

Referring to FIGS. 3 and 4, step S120 may include step S210 of preprogramming the one or more memory cells to be programmed to the third program state PS3 (i.e., the target program state) based on the first preprogram reference voltage among the target memory cells. In the case where 2-bit data is stored in one memory cell as shown in FIG. 2, the third program state PS3 is the highest program state and thus may be determined as the target program state. Therefore, the preprogram may be performed on the basis of the preprogram reference voltage to one or more memory cells to be programmed to the third program state PS3 among the target memory cells.

Figure 5:
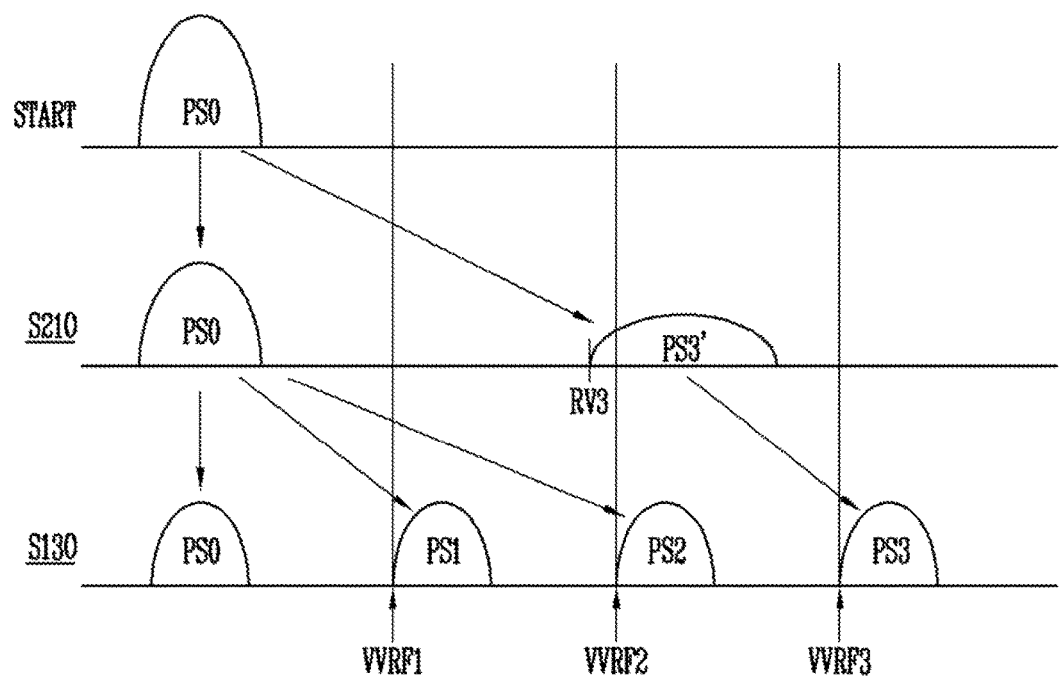
FIG. 5 is a diagram illustrating the preprogram step shown in FIG. 4.

FIG. 5 is a diagram illustrating the preprogram step of S210 shown in FIG. 4.

Referring to FIGS. 3 and 5, it is assumed that the target memory cells of the memory cell array are in the erase state PS0. At step S110, the preprogram target state and the corresponding preprogram reference voltage are determined. In the case of FIG. 5, the third program state PS3 is determined as the preprogram target state. The preprogram may be performed on the basis of the preprogram reference voltage to one or more memory cells to be programmed to the third program state PS3 as the preprogram target state among the target memory cells at step S120.

Among all of the target memory cells that are in the erase state PS0, the preprogram is performed on the basis of the preprogram reference voltage RV3 to the memory cells to be programmed to the third program state PS3 (i.e., the preprogram target state) at step S210. The preprogram reference voltage RV3 may be used for preprogram operation corresponding to the highest program state, i.e. the third program state PS3. The preprogram reference voltage RV3 is determined at step S110. That is, the preprogram is performed to one or more memory cells to be programmed to the third program state PS3 among the target memory cells until the threshold voltages of all of the one or more memory cells exceed the preprogram reference voltage RV3. The preprogram may be performed by repeating a process of repeatedly apply program pulses to the one or more memory cells to be programmed to the third program state PS3 among the target memory cells and checking whether the threshold voltages of all of the one or more memory cells exceed the preprogram reference voltage RV3. The preprogram reference voltage RV3 may have a value less than the third verify voltage VVRF3. The memory cells to be programmed to the third program state PS3 may be programmed to an intermediate state PS3' by the preprogram step S210.

Thereafter, at step S130, the target memory cells are main-programmed to respective program states. That is, some of the memory cells that are in the erase state PS0 among the target memory cells are programmed to the first program state PS1 and the second program state PS2. The memory cells that are in the intermediate state PS3' among the target memory cells are programmed to the third program state PS3. During this process, the first to third verify voltages VVRF1 to VVRF3 may be used.

Through the steps S110 to S130 and S210, all of the target memory cells may be programmed to corresponding program states PS1 to PS3 with reduced effects of interference and disturbance from adjacent memory cells since the memory cells to be programmed to the highest program state (i.e., the preprogram target state) among the target memory cells are programmed to an intermediate state PS3' in advance and then all of the target memory cell are programmed to corresponding program states PS1 to PS3. During the main-program to the memory cells in the intermediate state PS3', the rest of the target memory cell may experience reduced effects of interference and disturbance from the programming of the memory cells from the intermediate state PS3' to the highest program state (i.e., the preprogram target state).

Figure 6:
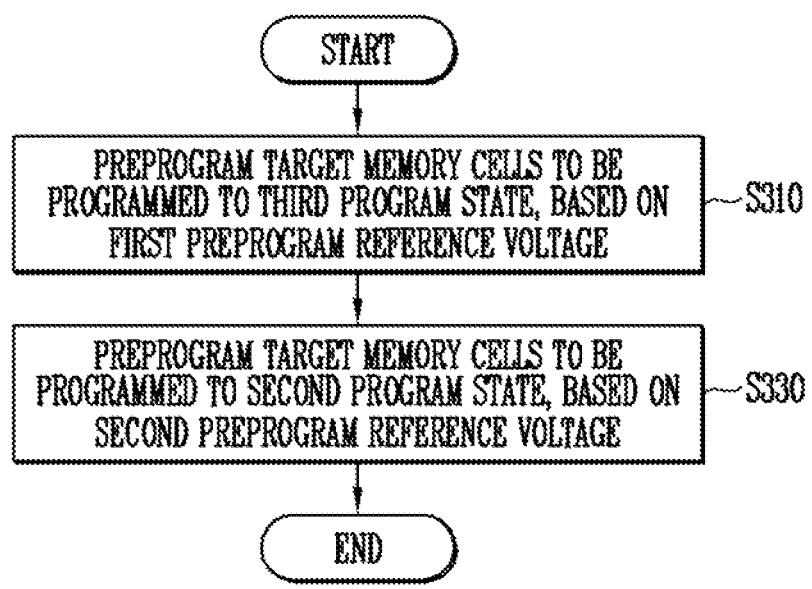
FIG. 6 is a flowchart illustrating another example of the preprogram step shown in FIG. 3.

FIG. 6 is a flowchart illustrating another example of the preprogram step of S120 shown in FIG. 3.

Referring to FIGS. 3 and 6, step S120 may include step S310 of preprogramming the one or more memory cells to be programmed to the third program state PS3 (i.e., the target program state) based on a first preprogram reference voltage among the target memory cells, and step S330 of preprogramming the one or more memory cells to be programmed to the second program state PS2 (i.e., another target program state) based on a second preprogram reference voltage among the target memory cells. In the case where 2-bit data is stored in one memory cell as shown in FIG. 2, the third program state PS3 is the highest program state and thus may be determined as the target program state. Therefore, the preprogram may be performed on the basis of the preprogram reference voltages to one or more memory cells to be programmed to the third program state PS3 that is the highest program state and the second program state PS2 that is the second highest program state among the target memory cells.

Figure 7:
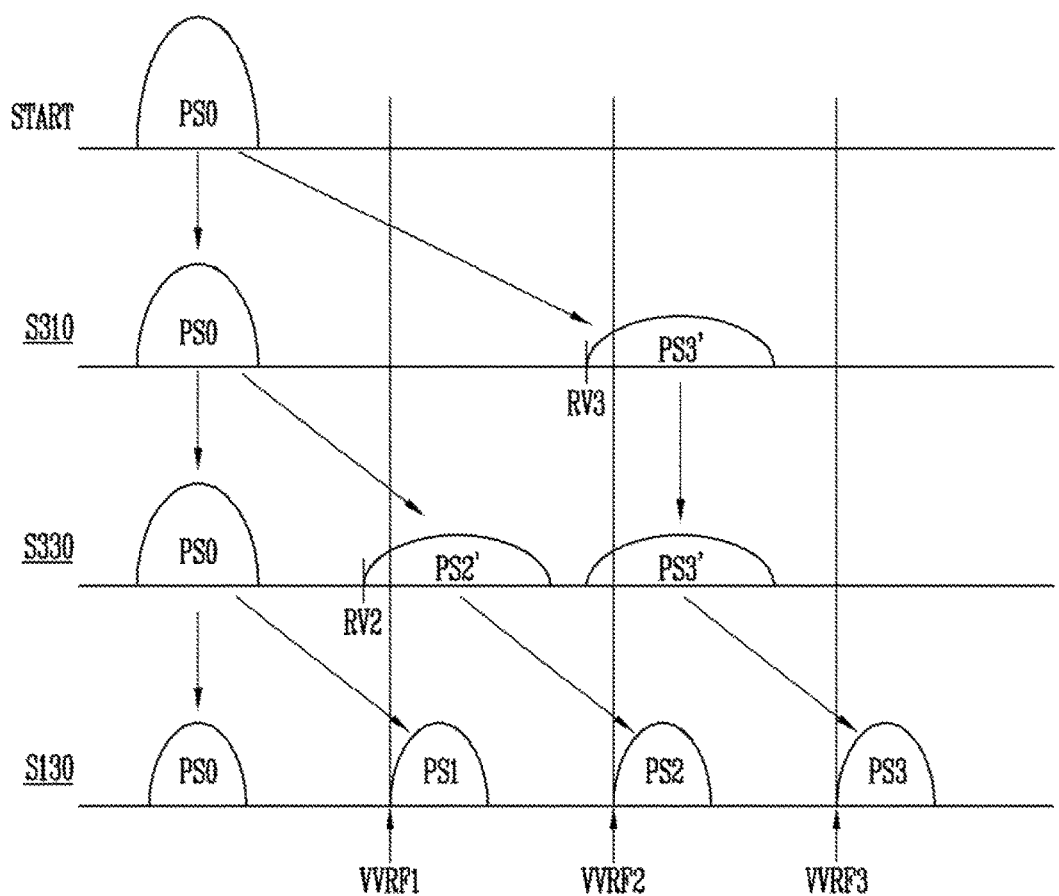
FIG. 7 is a diagram illustrating the preprogram step shown in FIG. 6.

FIG. 7 is a diagram illustrating the preprogram steps of S310 and S330 shown in FIG. 6.

Referring to FIGS. 3 and 7, it is assumed that the target memory cells of the memory cell array are in the erase state PS0. At step S110, the preprogram target states and the corresponding preprogram reference voltages are determined. In the case of FIG. 7, the third program state PS3 and the second program state PS2 are determined as the preprogram target states. The preprogram may be performed on the basis of the preprogram reference voltages to one or more memory cells to be respectively programmed to the third program state PS3 and the second program state PS2 as the preprogram target states at step S120.

Among all of the target memory cells that are in the erase state PS0, the preprogram is performed on the basis of the first preprogram reference voltage RV3 to the memory cells to be programmed to the third program state PS3 (i.e., the preprogram target state) at step S310. The first preprogram reference voltage RV3 is determined at step S110. That is, the preprogram is performed to one or more memory cells to be programmed to the third program state PS3 among the target memory cells until the threshold voltages of all of the one or more memory cells exceed the first preprogram reference voltage RV3. The memory cells to be programmed to the third program state PS3 may be programmed to a first intermediate state PS3' by the preprogram step S310.

Among all of the target memory cells that are in the erase state PS0, the preprogram is performed on the basis of the second preprogram reference voltage RV2 to the memory cells to be programmed to the second program state PS2 (i.e., another preprogram target state) at step S330. The second preprogram reference voltage RV2 is determined at step S110. That is, the preprogram is performed to one or more memory cells to be programmed to the second program state PS2 among the target memory cells until the threshold voltages of all of the one or more memory cells exceed the second preprogram reference voltage RV2. The second preprogram reference voltage RV2 may have a value less than the second verify voltage VVRF2. The memory cells to be programmed to the second program state PS2 may be programmed to a second intermediate state PS2' by the preprogram step S330.

Thereafter, at step S130, the target memory cells are main-programmed to respective program states. That is, some of the memory cells that are in the erase state PS0 among the target memory cells are programmed to the first program state PS1. The memory cells that are in the intermediate state PS2' among the target memory cells are programmed to the second program state PS2. The memory cells that are in the intermediate state PS3' among the target memory cells are programmed to the third program state PS3. During this process, the first to third verify voltages VVRF1 to VVRF3 may be used.

In the embodiment of FIG. 5, the preprogram is performed for one preprogram target state (i.e., the highest program state PS3), but in the embodiment of FIG. 7, the preprogram is performed for two preprogram target states (i.e., the highest and second highest program states PS2 and PS3).

Through the steps S110 to S130 and S310 to S330, all of the target memory cells may be programmed to corresponding program states PS1 to PS3 with reduced effects of interference and disturbance from adjacent memory cells since the memory cells to be programmed to the highest and second highest program states (i.e., the preprogram target states) among the target memory cells are programmed to intermediate states PS2' and PS3' in advance and then all of the target memory cell are programmed to corresponding program states PS1 to PS3. During the main-program to the memory cells in the intermediate states PS2' and PS3', the rest of the target memory cell may experience reduced effects of interference and disturbance from the programming of the memory cells from the intermediate states PS2' and PS3' to the highest and second highest program states (i.e., the preprogram target states), respectively.

Figure 8:
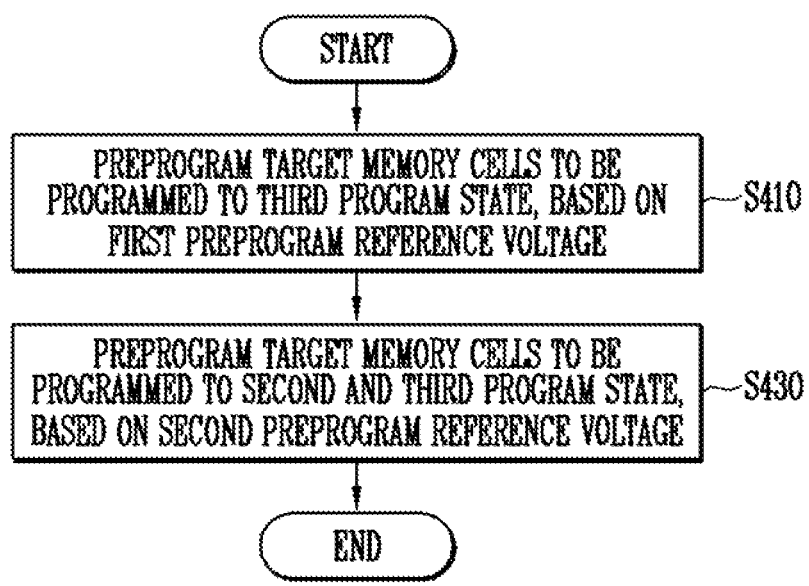
FIG. 8 is a flowchart illustrating yet another example of the preprogram step shown in FIG. 3.
Figure 9:
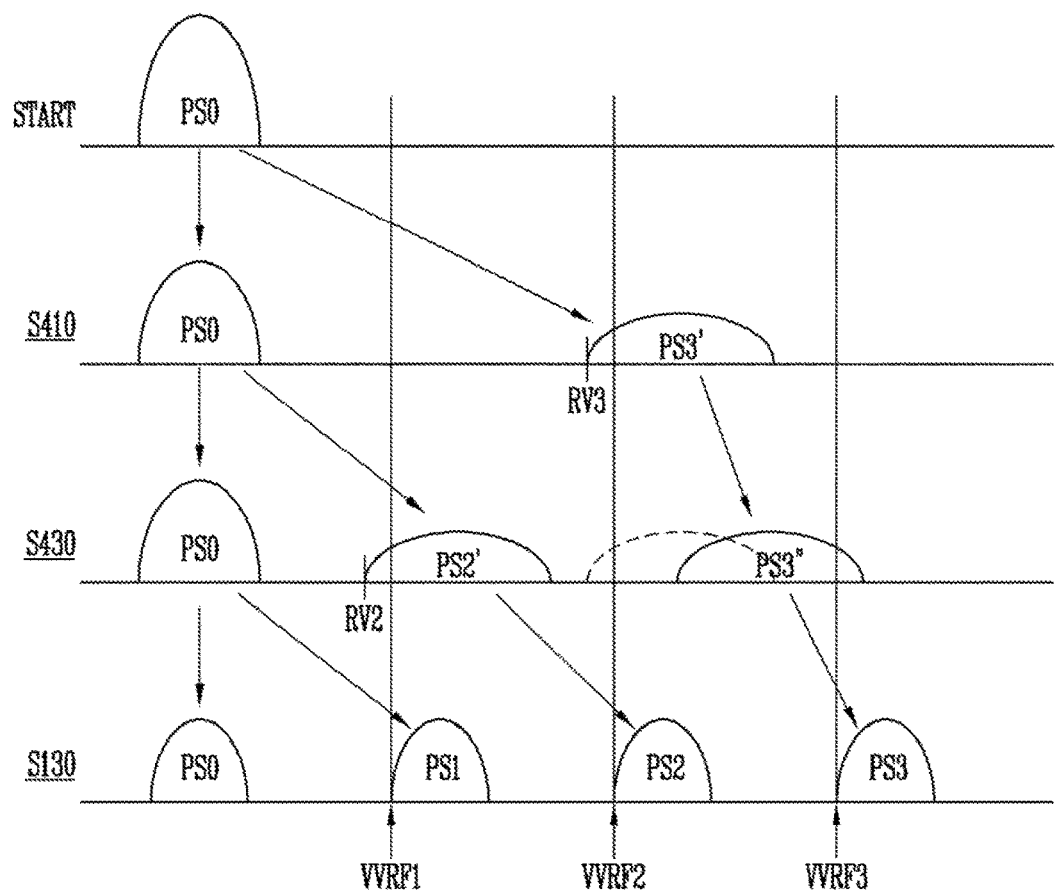
FIG. 9 is a diagram illustrating the preprogram step shown in FIG. 8.

FIG. 8 is a flowchart illustrating still another example of the preprogram step of S120 shown in FIG. 3. FIG. 9 is a diagram illustrating the preprogram steps of S410 and S430 shown in FIG. 8.

Referring to FIGS. 3 and 8, step S120 may include step S410 of preprogramming the one or more memory cells to be programmed to the third program state PS3 (i.e., the target program state) based on the first preprogram reference voltage RV3 among the target memory cells, and step S430 of preprogramming the one or more memory cells to be programmed to the second program state PS2 (i.e., another target program state) and the third program state PS3 based on the second preprogram reference voltage RV2 among the target memory cells.

In the embodiment of FIG. 6, during the preprogram to the memory cells to be programmed to the second program state PS2 at step S330, the preprogram is not performed to the memory cells to be programmed to the third program state PS3. On the other hand, in the embodiment of FIG. 8, during the preprogram to the memory cells to be programmed to the second program state PS2 at step S430, the preprogram is performed to the memory cells to be programmed to the third program state PS3 together with the preprogram to the memory cells to be programmed to the second program state PS2. Consequently, as shown in FIG. 9, the memory cells preprogrammed to the first intermediate state PS3' at step S410 are further preprogrammed to a third intermediate state PS3" at step S430 of preprogramming the one or more memory cells to be programmed to the second program state PS2 and the third program state PS3 based on the second preprogram reference voltage RV2 among the target memory cells. Thereby, in the embodiment of FIG. 9, the first preprogram reference voltage RV3 may have a comparatively low value. The rest of the embodiment of FIGS. 8 and 9 is the same as that of the embodiment of FIGS. 6 and 7.

Figure 10:
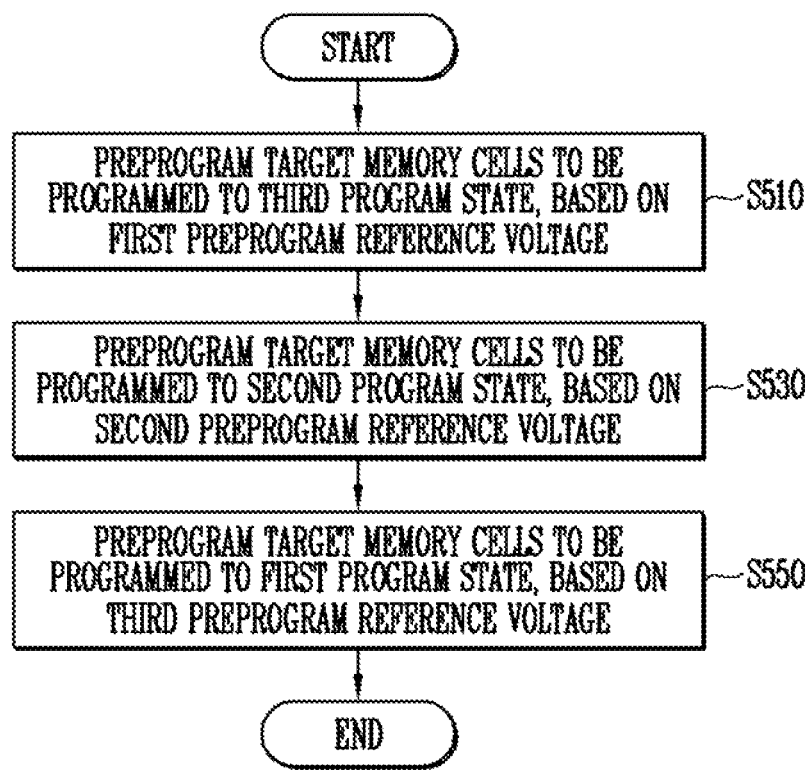
FIG. 10 is a flowchart illustrating still another example of the preprogram step shown in FIG. 3.

FIG. 10 is a flowchart illustrating still another example of the preprogram step of S120 shown in FIG. 3.

Referring to FIGS. 3 and 10, step S120 may include step S510 of preprogramming the one or more memory cells to be programmed to the third program state PS3 (i.e., the target program state) based on the first preprogram reference voltage among the target memory cells, step S530 of preprogramming the one or more memory cells to be programmed to the second program state PS2 (i.e., another target program state) based on the second preprogram reference voltage among the target memory cells, and step S550 of preprogramming the one or more memory cells to be programmed to the first program state PS1 (i.e., still another target program state) based on the third preprogram reference voltage among the target memory cells. In the case where 2-bit data is stored in one memory cell as shown in FIG. 2, the third program state PS3 is the highest program state and thus may be determined as the target program state. Therefore, the preprogram may be performed on the basis of the preprogram reference voltages to one or more memory cells to be programmed to the third program state PS3 that is the highest program state, the second program state PS2 that is the second highest program state among the target memory cells, and the first program state PS1 that the third highest program state among the target memory cells.

Figure 11:
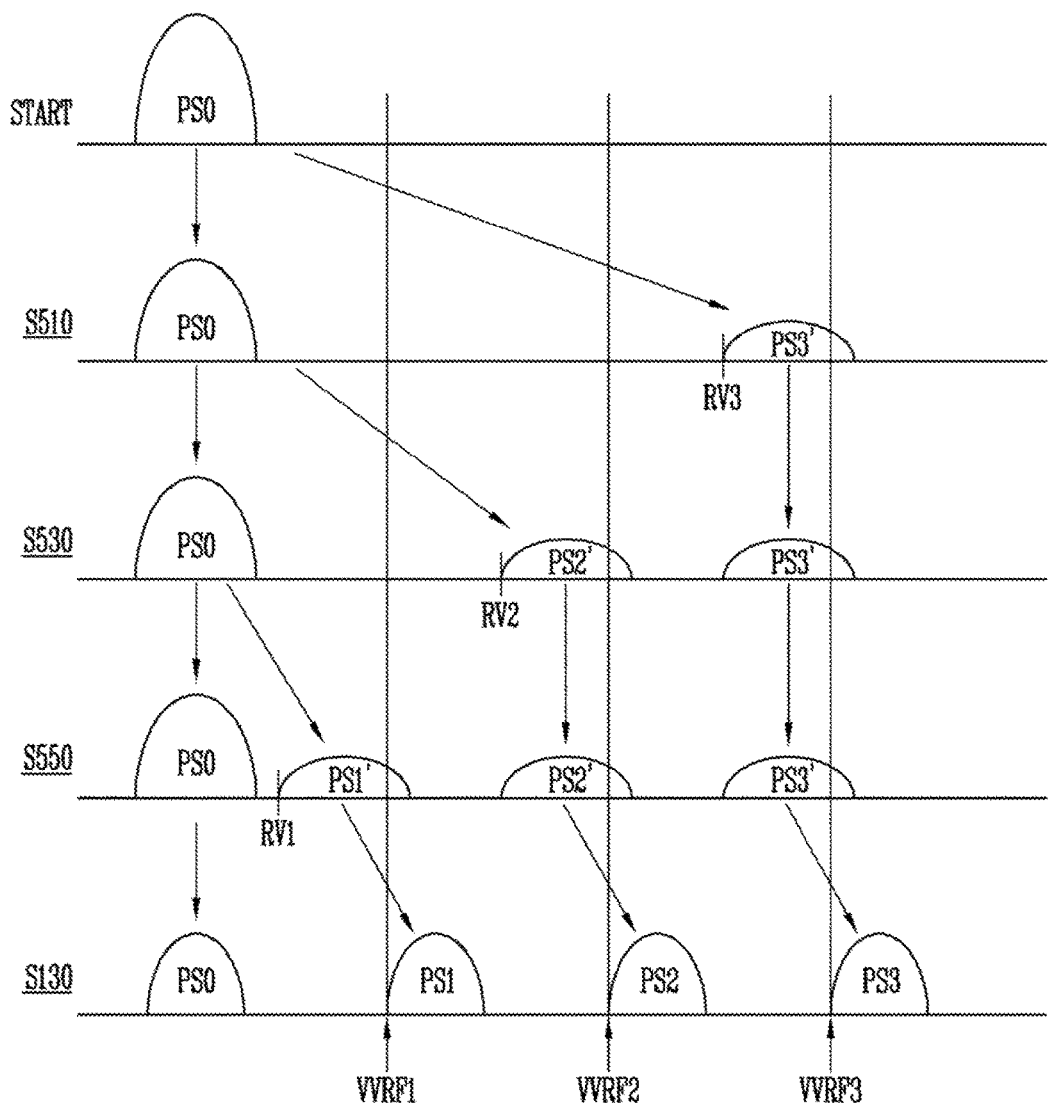
FIG. 11 is a diagram illustrating the preprogram step shown in FIG. 10.

FIG. 11 is a diagram illustrating the preprogram steps of S510 to S550 shown in FIG. 10.

Referring to FIGS. 3 and 11, it is assumed that the target memory cells of the memory cell array are in the erase state PS0. At step S110, the preprogram target states and the corresponding preprogram reference voltages are determined. In the case of FIG. 11, the third program state PS3, the second program state PS2, and the first program state PS1 are determined as the preprogram target states. The preprogram may be performed on the basis of the preprogram reference voltages to one or more memory cells to be respectively programmed to the third program state PS3, the second program state PS2, and the first program state PS1 as the preprogram target states at step S120.

Among all of the target memory cells that are in the erase state PS0, the preprogram is performed on the basis of the first preprogram reference voltage RV3 to the memory cells to be programmed to the third program state PS3 (i.e., the preprogram target state) at step S510. The first preprogram reference voltage RV3 is determined at step S110. The memory cells to be programmed to the third program state PS3 may be programmed to a first intermediate state PS3' by the preprogram step S510.

Among all of the target memory cells that are in the erase state PS0, the preprogram is performed on the basis of the second preprogram reference voltage RV2 to the memory cells to be programmed to the second program state PS2 (i.e., another preprogram target state) at step S530. The second preprogram reference voltage RV2 is determined at step S110. The memory cells to be programmed to the second program state PS2 may be programmed to a second intermediate state PS2' by the preprogram step S530.

Among all of the target memory cells that are in the erase state PS0, the preprogram is performed on the basis of the third preprogram reference voltage RV1 to the memory cells to be programmed to the first program state PS1 (i.e., still another preprogram target state) at step S550. The third preprogram reference voltage RV1 is determined at step S110. The memory cells to be programmed to the first program state PS1 may be programmed to a third intermediate state PS1' by the preprogram step S550.

Thereafter, at step S130, the target memory cells are main-programmed to respective program states. That is, the memory cells that are in the third intermediate state PS1' are programmed to the first program state PS1. The memory cells that are in the second intermediate state PS2' are programmed to the second program state PS2. The memory cells that are in the first intermediate state PS3' are programmed to the third program state PS3. During this process, the first to third verify voltages VVRF1 to VVRF3 may be used. As shown in FIG. 11, the third preprogram reference voltage RV1 may have a value less than the first verify voltage VVRF1. The second preprogram reference voltage RV2 may have a value less than the second verify voltage VVRF2. The first preprogram reference voltage RV3 may have a value less than the third verify voltage VVRF3.

In the embodiment of FIG. 5, the preprogram is performed for one preprogram target state (i.e., the highest program state PS3), and in the embodiments of FIGS. 7 and 9, the preprogram is performed for two preprogram target states (i.e., the highest and second highest program states PS2 and PS3). On the other hand, in the embodiment of FIG. 11, the preprogram is performed for three preprogram target states (i.e., the highest and second and third highest program states PS1, PS2 and PS3). In any embodiment, a preprogram for the highest program state PS3 is necessarily performed.

Through the steps S110 to S130 and S510 to S550, all of the target memory cells may be programmed to corresponding program states PS1 to PS3 with reduced effects of interference and disturbance from adjacent memory cells since the memory cells to be programmed to the highest and second and third highest program states (i.e., the preprogram target states) among the target memory cells are programmed to intermediate states PS1', PS2'' and PS3''' in advance and then all of the target memory cell are programmed to corresponding program states PS1 to PS3. During the main-program to the memory cells in the intermediate states PS1', PS2'' and PS3''', the rest of the target memory cell may experience reduced effects of interference and disturbance from the programming of the memory cells from the intermediate states PS1', PS2'' and PS3''' to the highest and second and third highest program states (i.e., the preprogram target states), respectively.

Figure 12:
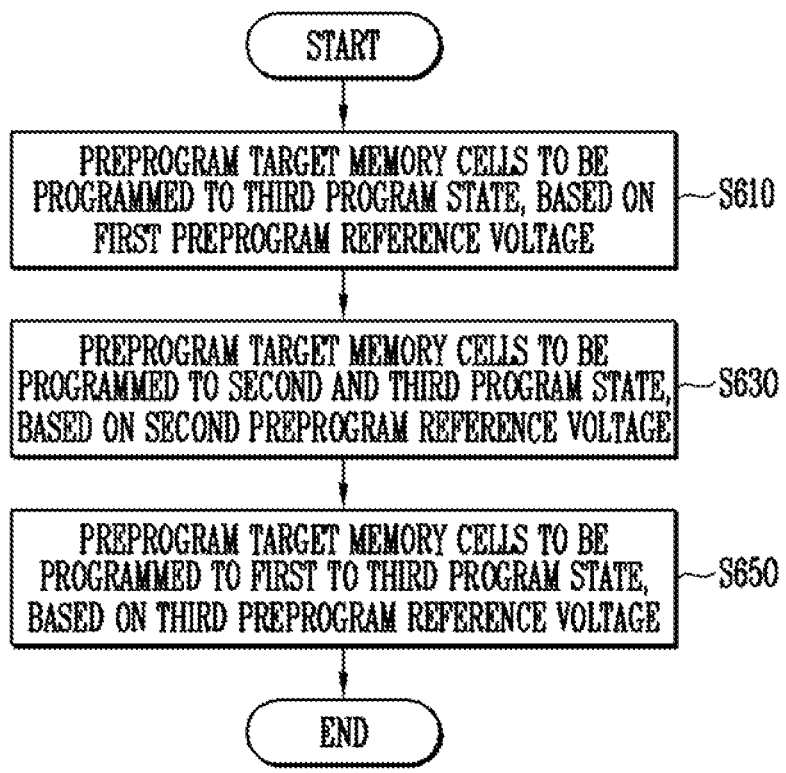
FIG. 12 is a flowchart illustrating still another example of the preprogram step shown in FIG. 3.
Figure 13:
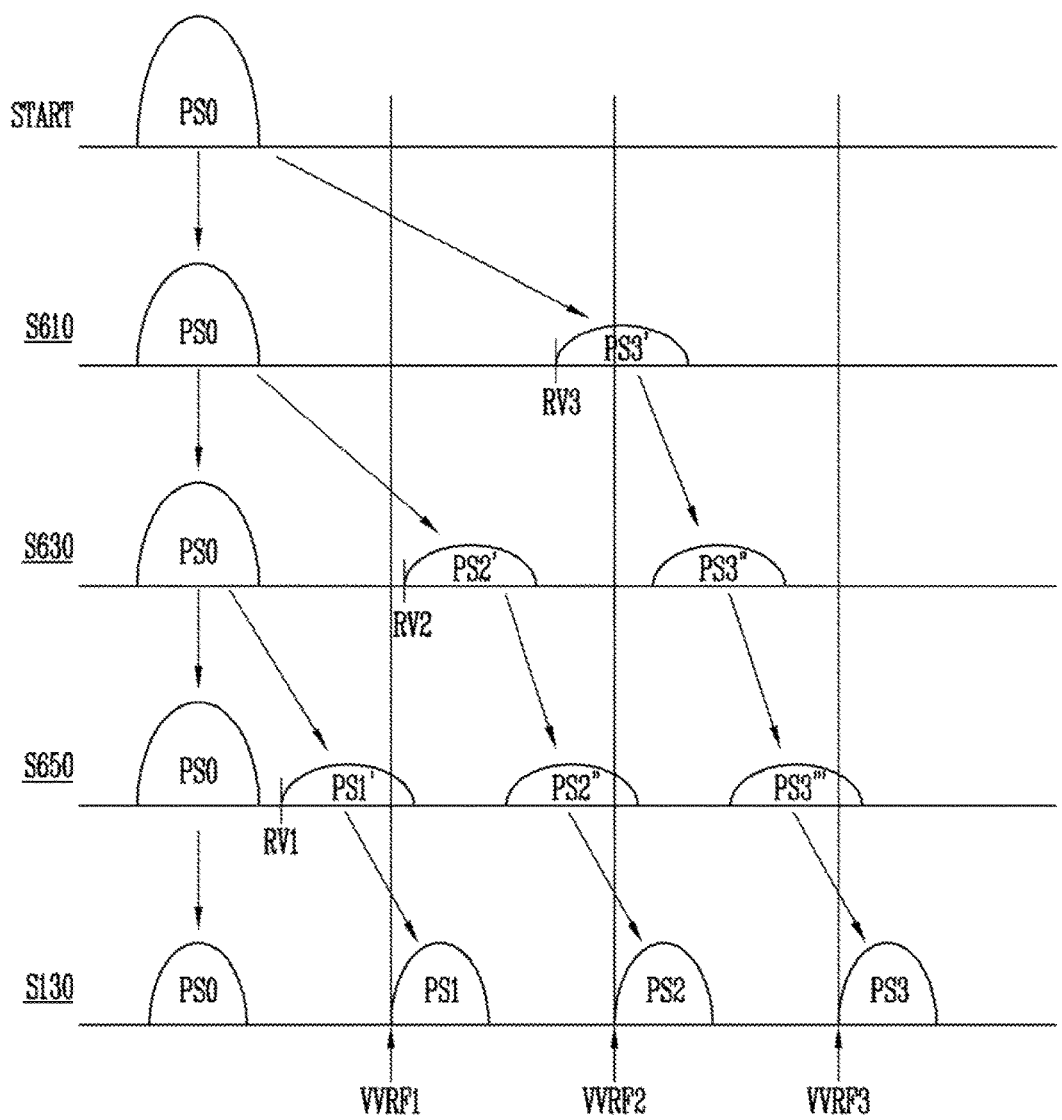
FIG. 13 is a diagram illustrating the preprogram step shown in FIG. 12.

FIG. 12 is a flowchart illustrating still another example of the preprogram step of S120 shown in FIG. 3. FIG. 13 is a diagram illustrating the preprogram steps of S610 to S650 shown in FIG. 12.

Referring to FIGS. 3 and 12, step S120 may include step S610 of preprogramming the one or more memory cells to be programmed to the third program state PS3 (i.e., the target program state) based on the first preprogram reference voltage RV3 among the target memory cells, step S630 of preprogramming the one or more memory cells to be programmed to the second program state PS2 (i.e., another target program state) and the third program state PS3 based on the second preprogram reference voltage RV2 among the target memory cells, and step S650 of preprogramming the one or more memory cells to be programmed to the first program states PS1 (i.e., still another target program state) together with the second and third program states PS2 and PS3 based on the third preprogram reference voltage RV1 among the target memory cells.

In the embodiment of FIG. 10, during the preprogram to the memory cells to be programmed to the second program state PS2 at step S530, the preprogram is not performed to the memory cells to be programmed to the third program state PS3. On the other hand, in the embodiment of FIG. 12, during the preprogram to the memory cells to be programmed to the second program state PS2 at step S630, the preprogram is performed to the memory cells to be programmed to the third program state PS3 together with the preprogram to the memory cells to be programmed to the second program state PS2. In the embodiment of FIG. 10, during the preprogram to the memory cells to be programmed to the first program state PS1 at step S550, the preprogram is not performed to the memory cells to be programmed to the second and third program states PS2 and PS3. On the other hand, in the embodiment of FIG. 12, during the preprogram to the memory cells to be programmed to the first program state PS1 at step S650, the preprogram is performed to the memory cells to be programmed to the second and third program states PS2 and PS3 together with the preprogram to the memory cells to be programmed to the first program state PS1. Consequently, as shown in FIG. 13, the memory cells preprogrammed to the first intermediate state PS3' at step S610 are preprogrammed to a fourth intermediate state PS3" at step S630 of preprogramming the one or more memory cells to be programmed to the second and third program states PS2 and PS3 based on the second preprogram reference voltage RV2 among the target memory cells, and further are preprogrammed to a fifth intermediate state PS3''' by step S650 of preprogramming the one or more memory cells to be programmed to the first to third program states PS1 to PS3 based on the first preprogram reference voltage RV1 among the target memory cells. Further, the memory cells preprogrammed to the second intermediate state PS2' at step S630 are preprogrammed to a sixth intermediate state PS2" by step S650 of preprogramming the one or more memory cells to be programmed to the first to third program states PS1 to PS3 based on the first preprogram reference voltage RV1 among the target memory cells. Thereby, in the embodiment of FIG. 13, the first and second preprogram reference voltages RV3 and RV2 may have comparatively low values. The rest of the embodiment of FIGS. 12 and 13 is the same as that of the embodiment of FIGS. 10 and 11.

Figure 14:
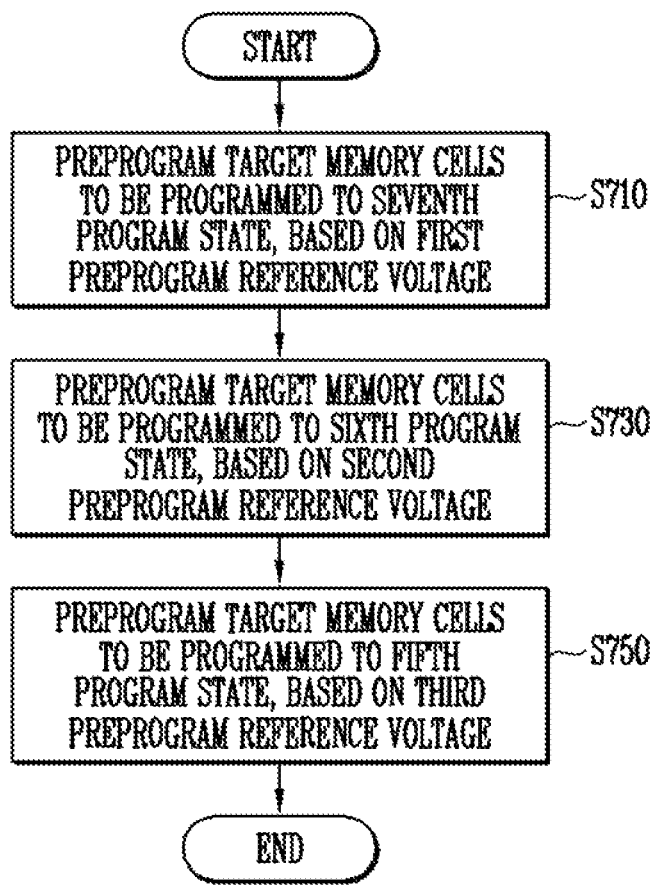
FIG. 14 is a flowchart illustrating an example of the step shown in FIG. 3 for memory cells each of which stores 3-bit data.

FIG. 14 is a flowchart illustrating an example of the step of S120 shown in FIG. 3 in case of memory cells each of which stores 3-bit data.

Figure 15:
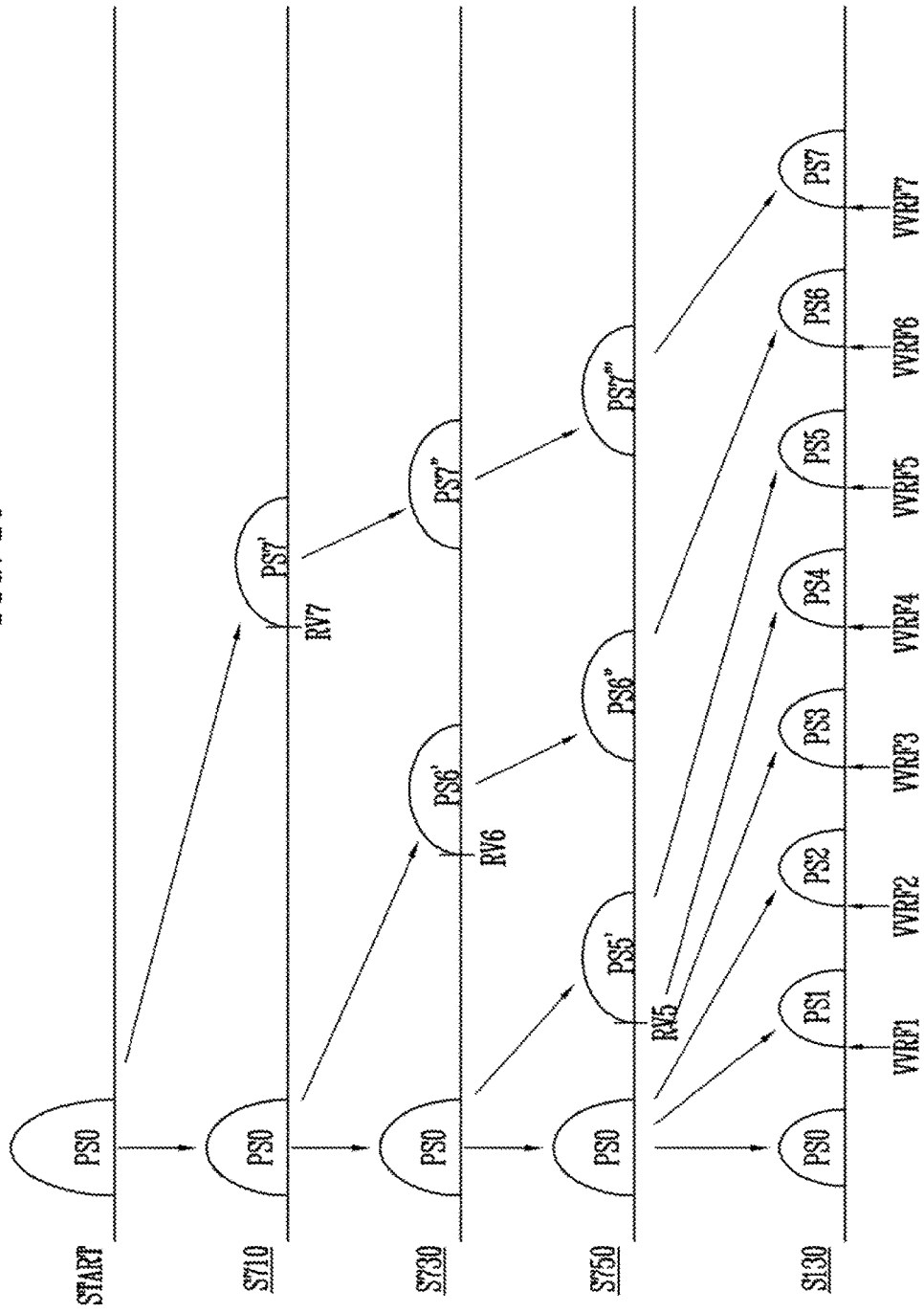
FIG. 15 is a diagram illustrating the preprogram step shown in FIG. 14.

FIGS. 14 and 15 are diagrams illustrating an embodiment of memory cells each of which stores 3-bit data. In the case where 3-bit data is stored in each memory cell unlike the case of FIG. 2, there are eight kinds of program states. For example, an erase state PS0 and first to seventh program states PS1 to PS7 are provided. Hence, in this case, the highest program state is the seventh program state PS7. Thus, at step S110, the one or more preprogram target states including the highest seventh program state PS7 and the corresponding preprogram reference voltages may be determined. FIG. 15 illustrates an example of the fifth to seventh program states PS5 to PS7 determined as the preprogram target states. However, the present invention is not limited to this. For example, various groups of program states including the seventh program state PS7 may be determined as the preprogram target states.

Referring to FIGS. 3 and 14, step S120 may include step S710 of preprogramming the one or more memory cells to be programmed to the seventh program state PS7 (i.e., the target program state) based on a first preprogram reference voltage among the target memory cells, step S730 of preprogramming the one or more memory cells to be programmed to the sixth program state PS6 (i.e., another target program state) based on a second preprogram reference voltage among the target memory cells, and step S750 of preprogramming the one or more memory cells to be programmed to the fifth program state PS5 (i.e., still another target program state) based on a third preprogram reference voltage among the target memory cells. In the case where 3-bit data is stored in one memory cell as shown in FIG. 15, the seventh program state PS7 is the highest program state and thus may be determined as the target program state. Therefore, the preprogram may be performed on the basis of the preprogram reference voltages to one or more memory cells to be programmed to the seventh program state PS7 that is the highest program state, the sixth program state PS6 that is the second highest program state among the target memory cells, and the fifth program state PS5 that is the third highest program state among the target memory cells.

FIG. 15 is a diagram illustrating the preprogram steps of S710 to S750 shown in FIG. 14.

Referring to FIGS. 3 and 15, it is assumed that the target memory cells of the memory cell array are in the erase state PS0. At step S110, the preprogram target states and the corresponding preprogram reference voltages are determined. In the case of FIG. 15, the seventh program state PS7, the sixth program state PS6, and the fifth program state PS5 are determined as the preprogram target states. The preprogram may be performed on the basis of the preprogram reference voltages to one or more memory cells to be respectively programmed to the seventh program state PS7, the sixth program state PS6, and the fifth program state PS5 as the preprogram target states at step S120.

Among all of the target memory cells that are in the erase state PS0, the preprogram is performed on the basis of the first preprogram reference voltage RV7 to the memory cells to be programmed to the seventh program state PS7 (i.e., the preprogram target state) at step S710. The preprogram reference voltage RV7 is determined at step S110. The memory cells to be programmed to the seventh program state PS7 may be programmed to a first intermediate state PS7' by the preprogram step S710.

Among all of the target memory cells that are in the erase state PS0, the preprogram is performed on the basis of the second preprogram reference voltage RV6 to the memory cells to be programmed to the sixth program state PS6 (i.e., another preprogram target state) at step S730. The second preprogram reference voltage RV6 is determined at step S110. The memory cells to be programmed to the sixth program state PS6 may be programmed to a second intermediate state PS6' by the preprogram step S730.

In an embodiment, the memory cells to be programmed to the seventh program state PS7 may be programmed to from the first intermediate state PS7' to a fourth intermediate state PS7" while the memory cells to be programmed to the sixth program state PS6 are programmed to the second intermediate state PS6' by preprogramming the one or more memory cells to be programmed to the sixth and seventh program states PS6 and PS7 based on the second preprogram reference voltage RV6 among the target memory cells, as exemplified in FIG. 15.

Among all of the target memory cells that are in the erase state PS0, the preprogram is performed on the basis of the third preprogram reference voltage RV5 to the memory cells to be programmed to the fifth program state PS5 (i.e., still another preprogram target state) at step S750. The third preprogram reference voltage RV5 is determined at step S110. The memory cells to be programmed to the fifth program state PS5 may be programmed to a third intermediate state PS5' by the preprogram step S750.

In an embodiment, the memory cells to be programmed to the sixth and seventh program states PS6 and PS7 may be programmed from the second and fourth intermediate states PS6' and PS7" to fifth and sixth intermediate states PS6" and PS7''' while the memory cells to be programmed to the fifth program state PS5 are programmed to the third intermediate state PS5' by preprogramming the one or more memory cells to be programmed to the fifth to seventh program states PS5 to PS7 based on the third preprogram reference voltage RV5 among the target memory cells, as exemplified in FIG. 15.

Thereafter, at step S130, the target memory cells are main-programmed to respective program states. That is, the memory cells that are in the erase state PS0 are programmed to first to fourth program states PS1 to PS4. The memory cells that are in the third intermediate state PS5' are programmed to the fifth program state PS5. The memory cells that are in the fifth intermediate state PS6" are programmed to the sixth program state PS6. The memory cells that are in the sixth intermediate state PS7'" are programmed to the seventh program state PS7. During this process, first to seventh verify voltages VVRF1 to VVRF7 may be used. As shown in FIG. 15, the third preprogram reference voltage RV5 may have a value less than a fifth verify voltage VVRF5. The second preprogram reference voltage RV6 may have a value less than a sixth verify voltage VVRF6. The first preprogram reference voltage RV7 may have a value less than a seventh verify voltage VVRF7.

Through the steps S110 to S130 and S710 to S750, all of the target memory cells may be programmed to corresponding program states PS1 to PS7 with reduced effects of interference and disturbance from adjacent memory cells since the memory cells to be programmed to the highest and second and third highest program states (i.e., the preprogram target states) among the target memory cells are programmed to intermediate states PS5', PS6" and PS7'" in advance and then all of the target memory cell are programmed to corresponding program states PS1 to PS7. During the main-program to the memory cells in the intermediate states PS5', PS6" and PS7'", the rest of the target memory cell may experience reduced effects of interference and disturbance from the programming of the memory cells from the intermediate states PS5', PS6" and PS7'" to the highest and second and third highest program states (i.e., the preprogram target states), respectively.

In an embodiment, the same operation may be performed for memory cells each of which stores four or more bits of data. In other words, in the case N-bit data (N is a natural number of 4 or more) is stored in each memory cell, the memory cells are in any one state of an erase state and first to $(2^N-1)^{th}$ program states, and the same preprogram operation may also be performed for a semiconductor memory device pertaining to this.

Figure 16:
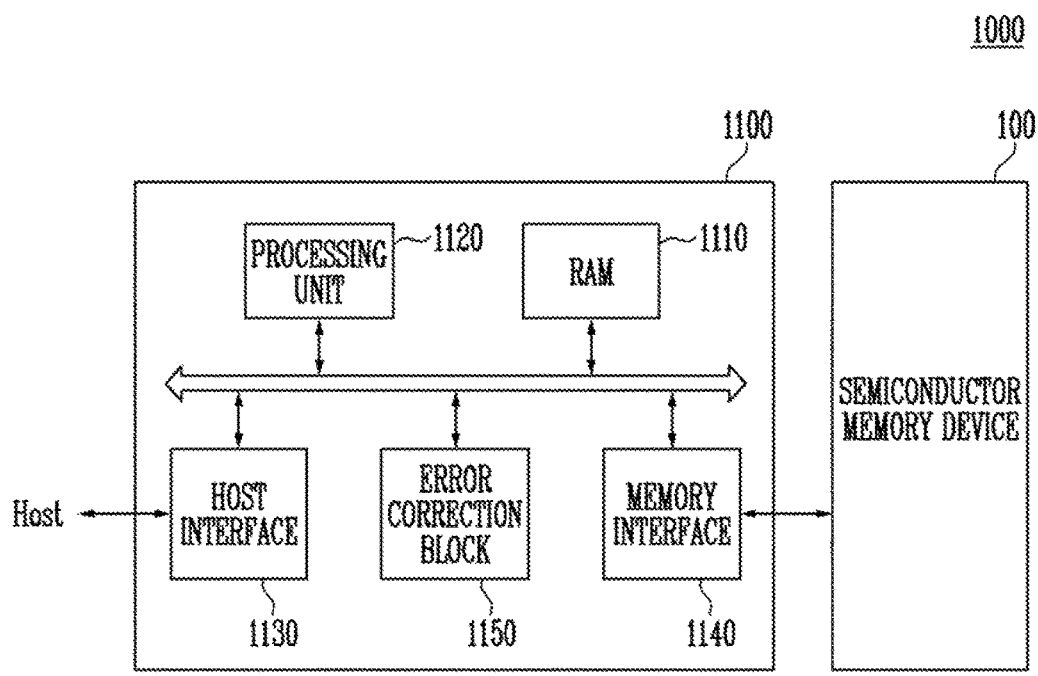
FIG. 16 is a block diagram showing a memory system including the semiconductor memory device of FIG. 1.

FIG. 16 is a block diagram illustrating a memory system including the semiconductor memory device of FIG. 1.

Referring to FIG. 16, the memory system 1000 includes the semiconductor memory device 100 and a controller 1100. The semiconductor memory device 100 may be the semiconductor memory device described with reference to FIG. 1. Hereinafter, repetitive explanations will be omitted.

The controller 1100 is coupled to a host Host and the semiconductor memory device 100. The controller 1100 is configured to access the semiconductor memory device 100 in response to a request from the host Host. For example, the controller 1100 is configured to control read, write, erase, and background operations of the semiconductor memory device 100. The controller 1100 is configured to provide an interface between the host Host and the semiconductor memory device 100. The controller 1100 is configured to drive firmware for controlling the semiconductor memory device 100.

The controller 1100 includes a RAM (Random Access Memory) 1110, a processing unit 1120, a host interface 1130, a memory interface 1140, and an error correction block 1150. The RAM 1110 is used as at least one of an operation memory of the processing unit 1120, a cache memory between the semiconductor memory device 100 and the host Host, and a buffer memory between the semiconductor memory device 100 and the host Host. The processing unit 1120 controls the overall operation of the controller 1100. In addition, the controller 1100 may temporarily store program data provided from the host Host during the write operation.

The host interface 1130 includes a protocol for performing data exchange between the host Host and the controller 1100. In an exemplary embodiment, the controller 1100 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1140 interfaces with the semiconductor memory device 100. For example, the memory interface includes a NAND interface or NOR interface.

The error correction block 1150 uses an error correcting code (ECC) to detect and correct an error in data received from the semiconductor memory device 100. The processing unit 1120 may adjust the read voltage according to an error detection result from the error correction block 1150, and control the semiconductor memory device 100 to perform re-reading. In an exemplary embodiment, the error correction block may be provided as an element of the controller 1100.

The controller 1100 and the semiconductor memory device 100 may be integrated into a single semiconductor device. In an exemplary embodiment, the controller 1100 and the semiconductor memory device 100 may be integrated into a single semiconductor device to form a memory card. For example, the controller 1100 and the semiconductor memory device 100 may be integrated into a single semiconductor device and form a memory card such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), a universal flash storage (UFS), and the like.

The controller 1100 and the semiconductor memory device 100 may be integrated into a single semiconductor device to form a solid state drive (SSD). The SSD includes a storage device formed to store data in a semiconductor memory. When the memory system 1000 is used as the SSD, an operation speed of the host Host coupled to the memory system 2000 may be phenomenally improved.

In another embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various devices for forming a home network, one of various electronic devices for forming a computer network, one of various electronic devices for forming a telematics network, an RFID device, one of various elements for forming a computing system, or the like.

In an exemplary embodiment, the semiconductor memory device 100 or the memory system 1000 may be embedded in various types of packages. For example, the semiconductor memory device 100 or the memory system 1000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 17:
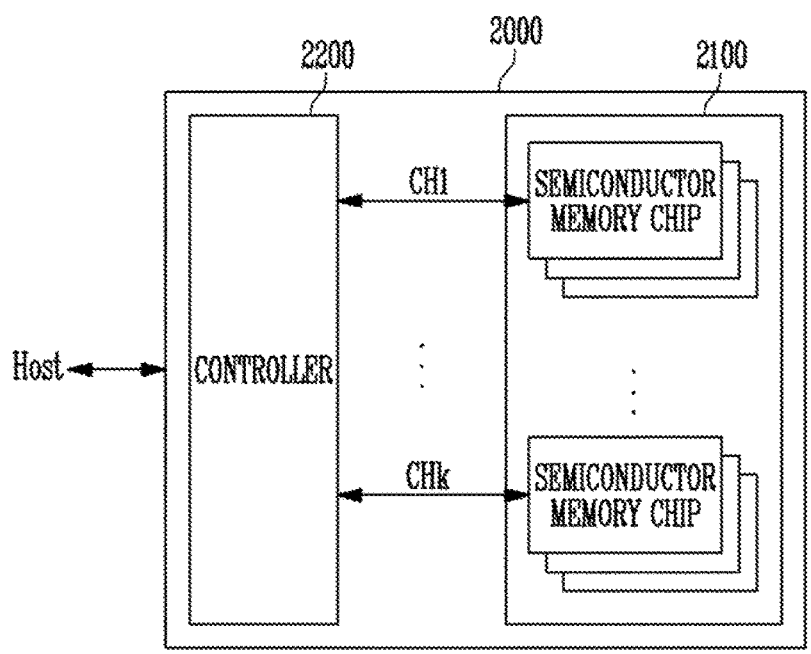
FIG. 17 is a block diagram showing an example of application of the memory system of FIG. 16.

FIG. 17 is a block diagram illustrating an example of application of the memory system of FIG. 16.

Referring to FIG. 17, the memory system 2000 includes a semiconductor memory device 2100 and a controller 2200. The semiconductor memory device 2100 includes a plurality of memory chips. The semiconductor memory chips are divided into a plurality of groups.

In FIG. 17, it is illustrated that each of the plurality of groups communicates with the controller 2200 through a corresponding one of first to k-th channels CH1 to CHk. Each semiconductor memory chip may have the same configuration and operation as those of an embodiment of the semiconductor memory device 100 described with reference to FIG. 1.

Each group communicates with the controller 2200 through one common channel. The controller 2200 has the same configuration as that of the controller 1100 described with reference to FIG. 8 and is configured to control a plurality of memory chips of the semiconductor memory device 2100 through the plurality of channels CH1 to CHk.

Figure 18:
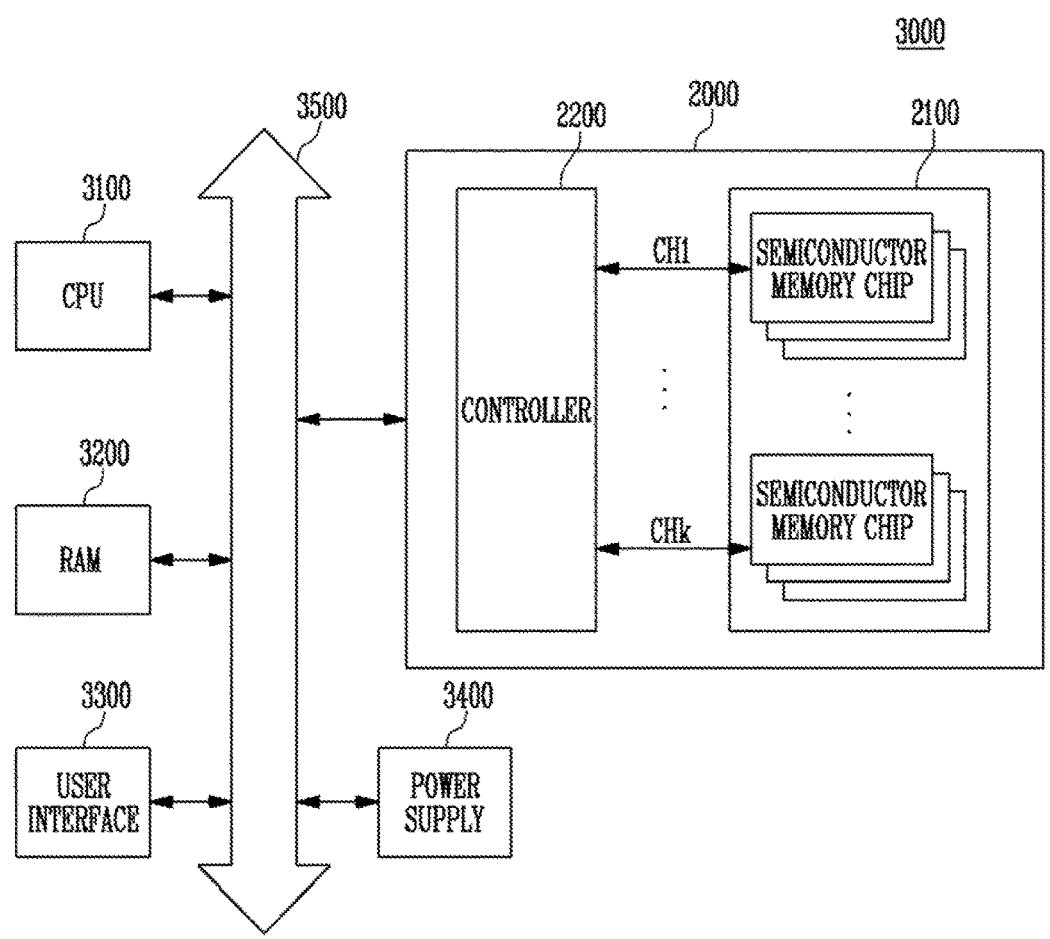
FIG. 18 is a block diagram showing a computing system including the memory system illustrated with reference to FIG. 17.

FIG. 18 is a block diagram illustrating a computing system including the memory system described with reference to FIG. 17.

The computing system 3000 may include a central processing unit (CPU) 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

In FIG. 18, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

In FIG. 18, the memory system 2000 described with reference to FIG. 17 is illustrated as being used. However, the memory system 2000 may be replaced with the memory system 1000 described with reference to FIG. 16. In an embodiment, the computing system 3000 may include all of the memory systems 1000 and 2000 described with reference to FIGS. 16 and 17.

An embodiment of the present disclosure provides a semiconductor memory device which is configured to reduce effects of interference and disturbance from adjacent memory cells during a program operation.

Another embodiment of the present disclosure provides a method of programming a semiconductor memory device which may reduce effects of interference and disturbance from adjacent memory cells.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device comprising:
a memory cell array a plurality of memory cells each of which stores N-bit data (N is an integer greater than 1);
a peripheral circuit configured to perform a program operation to the memory cells in the memory cell array; and
a control logic configured to control the peripheral circuit and the memory cell array such that, during a program operation to target memory cells to be programmed among the memory cells, a preprogram is performed to memory cells to be programmed to a highest program state among the target memory cells based on a pre-program reference voltage, and then a main program is performed to the target memory cells.

2. The semiconductor memory device according to claim 1,
wherein each of the target memory cells stores 2-bit data and is initially in an erase state, and
wherein the control logic controls the peripheral circuit and the memory cell array such that a preprogram is performed to memory cells to be programmed to the highest program state among the target memory cells based on a first reference voltage corresponding to the highest program state.

3. The semiconductor memory device according to claim 1,
wherein each of the target memory cells stores 2-bit data and is initially in an erase state, and
wherein the control logic controls the peripheral circuit and the memory cell array such that a preprogram is performed to memory cells to be programmed to the highest program state among the target memory cells based on a first reference voltage corresponding to the highest program state, and a preprogram is performed for memory cells to be programmed to a second highest program state among the target memory cells based on a second reference voltage corresponding to the second highest program state and lower than the first reference voltage.

4. The semiconductor memory device according to claim 1,
wherein each of the target memory cells stores 2-bit data and is initially in an erase state, and
wherein the control logic controls the peripheral circuit and the memory cell array such that a preprogram is performed to memory cells to be programmed to the highest program state among the target memory cells based on a first reference voltage corresponding to the highest program state, a preprogram is performed to memory cells to be programmed to a second highest program state based on a second reference voltage corresponding to the second highest program state and lower than the first reference voltage, and a preprogram is performed to memory cells to be programmed to a third highest program state among the target memory cells based on a third reference voltage corresponding to the third highest program state and lower than the second reference voltage.

5. The semiconductor memory device according to claim 2, wherein the first reference voltage is lower than a highest verify voltage used for verifying the main program to the highest program state.

6. The semiconductor memory device according to claim 3, wherein the first and second reference voltages are lower than highest and second highest verify voltages used for verifying the main program to the highest and second highest program states, respectively.

7. The semiconductor memory device according to claim 4, wherein the first to third reference voltages are lower than highest, second highest and third highest verify voltages used for verifying the main program to the highest, second highest and third highest program states, respectively.

8. The semiconductor memory device according to claim 1,
wherein each of the target memory cells stores 3-bit data and is initially in an erase state, and
wherein the control logic controls the peripheral circuit and the memory cell array such that a preprogram is performed to memory cells to be programmed to the highest program state among the target memory cells based on a first reference voltage corresponding to the highest program state.

9. The semiconductor memory device according to claim 1,
wherein each of the target memory cells stores N-bit data and is initially in an erase state, and
wherein the control logic controls the peripheral circuit and the memory cell array such that a preprogram is performed to memory cells to be programmed to the highest program state among the target memory cells based on a first reference voltage corresponding to the highest program state.

10. A method of programming a semiconductor memory device comprising a memory cell array including a plurality of memory cells each of which stores N-bit data (N is an integer greater than 1), the method comprising:
determining at least one preprogram target state including a highest program state and at least one preprogram reference voltage corresponding to the preprogram target state;
preprogramming one or more among target memory cells based on the preprogram target state and the preprogram reference voltage; and
main-programming the target memory cells.

11. The method according to claim 10,
wherein each of the target memory cells stores 2-bit data and is initially in an erase state, and
wherein the determining of the preprogram target state and the preprogram reference voltage comprises determining the highest program state as the preprogram target state, and determining a first reference voltage corresponding to the highest program state.

12. The method according to claim 11,
wherein the preprogramming of one or more among the target memory cells comprises preprogramming memory cells to be programmed to the highest program state among the target memory cells based on the first reference voltage, and
wherein the first reference voltage is lower than a highest verify voltage used for verifying main program to the highest program state in the main-programming of the target memory cells.

13. The method according to claim 10,
wherein each of the target memory cells stores 2-bit data and is initially in an erase state, and
wherein the determining of the preprogram target state and the preprogram reference voltage comprises determining the highest program state and a second highest program state as the preprogram target state, and determining a first reference voltage corresponding to the highest program state and a second reference voltage corresponding to the second highest program state and lower than the first reference voltage.

14. The method according to claim 13,
wherein the preprogramming of one or more among the target memory cells comprises:
preprogramming memory cells to be programmed to the highest program state among the target memory cells based on the first reference voltage; and
preprogramming memory cells to be programmed to the second highest program state among the target memory cells based on the second reference voltage, and
wherein the first and second reference voltages are lower than highest and second highest verify voltages used for verifying main program to the highest and second highest program states, respectively, in the main-programming of the target memory cells.

15. The method according to claim 13,
wherein the preprogramming of one or more among the target memory cells comprises:
preprogramming memory cells to be programmed to the highest program state among the target memory cells based on the first reference voltage; and
preprogramming memory cells to be programmed to the highest and the second highest program state among the target memory cells based on the second reference voltage, and
wherein the first and second reference voltages are lower than highest and second highest verify voltages used for verifying main program to the highest and second highest program states, respectively, in the main-programming of the target memory cells.

16. The method according to claim 10,
wherein each of the target memory cells stores 2-bit data and is initially in an erase state, and
wherein the determining of the preprogram target state and the preprogram reference voltage comprises determining the highest program state and second and third highest program states as the preprogram target state, and determining a first reference voltage corresponding to the highest program state, a second reference voltage corresponding to the second highest program state and lower than the first reference voltage, and a third reference voltage corresponding to the third highest program state and lower than the second reference voltage.

17. The method according to claim 16,
wherein the preprogramming of one or more among the target memory cells comprises:
preprogramming memory cells to be programmed to the highest program state among the target memory cells based on the first reference voltage;

preprogramming memory cells to be programmed to the second highest program state among the target memory cells based on the second reference voltage; and preprogramming memory cells to be programmed to the third highest program state among the target memory cells based on the third reference voltage, and wherein the first to third reference voltages are lower than highest and second and third highest verify voltages used for verifying main program to the highest and second and third highest program states, respectively, in the main-programming of the target memory cells.

18. The method according to claim 16, wherein the preprogramming of one or more among the target memory cells comprises:

preprogramming memory cells to be programmed to the highest program state among the target memory cells based on the first reference voltage;

preprogramming memory cells to be programmed to the highest and the second highest program states among the target memory cells based on the second reference voltage; and preprogramming memory cells to be programmed to the highest and the second and third highest program states among the target memory cells based on the third reference voltage, and wherein the first to third reference voltages are lower than highest and second and third highest verify voltages used for verifying main program to the highest and second and third highest program states, respectively, in the main-programming of the target memory cells.

19. The method according to claim 10, wherein each of the target memory cells stores 3-bit data and is initially in an erase state, and wherein the determining of the preprogram target state and the preprogram reference voltage comprises determining the highest program state as the preprogram target state, and determining a first reference voltage corresponding to the highest program state.

20. The method according to claim 10, wherein each of the target memory cells stores N-bit data and is initially in an erase state, and wherein the determining of the preprogram target state and the preprogram reference voltage comprises determining the highest program state as the preprogram target state, and determining a first reference voltage corresponding to the highest program state.

* * * * *